(12) United States Patent
Chang

(10) Patent No.: US 7,028,898 B2
(45) Date of Patent: Apr. 18, 2006

(54) LAYOUT STRUCTURE OF ELECTRODE LEAD WIRES FOR ORGANIC LED DISPLAY

(75) Inventor: Ching-Yun Chang, Taichung Hsien (TW)

(73) Assignee: Wintek Corporation, Taichung (TW)

( * ) Notice: Subject to any disclaimer, the term of this patent is extended or adjusted under 35 U.S.C. 154(b) by 762 days.

(21) Appl. No.: 10/121,819

(22) Filed: Apr. 12, 2002

(65) Prior Publication Data

US 2003/0193792 A1    Oct. 16, 2003

(51) Int. Cl.
*G06K 7/10* (2006.01)
(52) U.S. Cl. .................................. 235/454; 235/455
(58) Field of Classification Search ..............................
235/462.01–462.25, 455, 454; 347/238;
257/10, 100, 88, 89, 130; 361/778
See application file for complete search history.

(56) References Cited

U.S. PATENT DOCUMENTS

| | | | |
|---|---|---|---|
| 6,606,110 B1 * | 8/2003 | Gaudiana et al. ............ | 347/238 |
| 6,756,731 B1 * | 6/2004 | Sano .......................... | 313/499 |
| 6,828,170 B1 * | 12/2004 | Roberts et al. ............... | 438/27 |
| 2002/0118270 A1 * | 8/2002 | Gaudiana et al. ........... | 347/238 |
| 2003/0181694 A1 * | 9/2003 | Shirane et al. ............. | 536/23.1 |
| 2003/0193792 A1 * | 10/2003 | Chang ......................... | 361/778 |
| 2004/0239243 A1 * | 12/2004 | Roberts et al. ............. | 313/512 |

* cited by examiner

*Primary Examiner*—Thien M. Le
(74) *Attorney, Agent, or Firm*—Birch, Stewart, Kolasch & Birch, LLP

(57) ABSTRACT

A layout structure of electrode lead wires for organic light-emitting diode (OLED) display is provided for saving materials, simplifying fabrication process, and reducing power consumption so as to lower down the required driving voltage. The display comprises a plurality of cathode and anode electrodes and a plurality of electrode lead wires connected to the cathode electrodes and the anode electrodes respectively. The cathode and the anode lead wires made of a multi-layer metallic material having high conductivity and low impedance are laid on the same side of the transparent substrate.

14 Claims, 6 Drawing Sheets

LAYOUT STRUCTURE OF ELECTRODE LEAD WIRES FOR ORGANIC LED DISPLAY

FIELD OF THE INVENTION

This invention relates to a layout structure of electrode lead wires for OLED display (organic light-emitting diode display), in which the internal electrodes of the display are connected to an external driving circuit via the electrode lead wires.

BACKGROUND OF THE INVENTION

As the organic light-emitting diode display (OLED display) is commented advantageous in many aspects, such as volume, weight, self-lighting, wide vision-field, high resolution, high brightness, low power-consumption, and high response-speed, therefore, it is considered a promising flat display in next generation. Many makers and research laboratories have long since focused their attention and cast efforts on this subject, however, design of an OLED display is not as easy as expected, people should consider not only power consumption and lifetime thereof but also panel disposition, etc.

Until now, improvements have been made to power consumption and lifetime of the OLED, while, in regard with the panel design, the electrodes are distributed on sides laterally or even polygonally of a panel for the sake of solving the problem of driving voltage and power consumption of the electrodes. Nevertheless, the panel design in such a manner is defective in its structural complexity for assembling.

FIGS. 1A, 1B, and 1C show the structure, a cutaway sectional view in X-axis and in Y-axis of a conventional OLED display respectively. In those figures, an anode 104 and a cathode 105 are formed on a transparent substrate 101, in which a plurality of structural bodies composed of the cathode 105, a component layer 106, cathode ribs 108, and an insulation layer 107 by using forming technology of the cathode ribs 108. Another plurality of structural bodies is composed of the cathode 105 and the component layer 106. The cathode 105 is connected to an external driving circuit via its lead wires 103 and is covered with an inorganic layer or a metallic protective layer 102.

An OLED display module based on the structure shown in FIG. 1A might be in the form shown in FIGS. 2 or 3, in which FIG. 2 indicates the electrode layout structure of a conventional OLED display module. As shown in FIG. 2, a driving chip 207 is connected with a plurality of cathode lead wires 202 and anode lead wires 203 by using a flexible circuit board 206, in which the cathode lead wires 202 and the anode lead wires 203 are coupled with a cathode (not shown) or an anode (not shown) respectively. FIG. 3 indicates another electrode layout structure of the conventional OLED display module, in which a plurality of cathode lead wires 302 and anode lead wires 303 are jointed with an external driving circuit through two pieces of flexible circuit board 306. The other components shown in FIGS. 2 and 3 are a transparent substrate 201, an inorganic layer or a metallic protective layer 204, a display section 205, driving signal input pins 208, anode lead wires 303, an inorganic layer or a metallic protective layer 304, a display section 305, a printed circuit board 307, and driving signal input pins 308.

The OLED display module shown in FIGS. 2 and 3 is weak in needing more connection items, such as flexible circuit boards, thermal pressure papers, metallic clips, conductive rubber, etc. to have the cost uplifted and the fabrication process complicated.

SUMMARY OF THE INVENTION

The primary object of this invention is to save the material for making an organic light-emitting diode display (OLED display), simplify the fabrication process, and reduce the power consumption so as to lower down the required driving voltage.

In order to realize above object, a layout structure of electrode lead wires for organic light-emitting diode display (OLED display) comprises a transparent substrate, a plurality of cathode lead wires, first anode lead wires, and second anode lead wires.

The transparent substrate has a lateral section perpendicular to the extension direction of a plurality of cathode electrodes for serving an input end of the output signals of an external driving circuit. The cathode lead wires are connected to a plurality of cathode electrodes respectively and uniformly spaced on the lateral section. The first and the second anode lead wires are connected to one end of respective and correspondent anode electrodes and uniformly spaced on the lateral section of the transparent substrate.

For more detailed information regarding advantages or features of this invention, at least an example of preferred embodiment will be fully described below with reference to the annexed drawings.

BRIEF DESCRIPTION OF THE DRAWINGS

The related drawings in connection with the detailed description of this invention to be made later are described briefly as follows, in which.

DETAILED DESCRIPTION OF THE INVENTION

To lay the cathode and the anode lead wires of an OLED display (organic light-emitting diode display) together on the same side of a transparent substrate of the display would probably save the construction material more or less and simplify the fabrication process to some extent however, the power consumption and the driving voltage are uplifted on the other hand according to this invention.

In considering the situation that all the pixels are lightened at the same time, a cathode plate or pin would suffer the total current of a plurality of sub-circuit loops whereto the current from an anode is supplied, so that the current that enters the cathode is far greater than that exits the anode. Moreover, because of spatial limitation, the pin width of the cathode is narrowed to increase the impedance of its own that would inevitably uplift the power consumption as well as the driving voltage of the cathode. Besides, the impedance of the electrode lead wires will be heightened because the electrode lead wires are lengthened in the case both the cathode and the anode lead wires are arranged on the same side of the transparent substrate of the OLED display.

Two measures might be taken to solve abovesaid problem. The first is suggested to lower down the impedance of the electrodes and lead wires thereof by using multi-layer materials (such as Cr/Al/Cr, Ti/Al/Ti) or high-conductivity metallic materials (such as Al, Ag, Au, Pd, Pt) for the electrode lead wires; and using low impedance materials having work function about the same with the OLED component layer (such as Al, Mg, Ag) for the cathode while using high permeability and low impedance materials having work function about the same with the OLED component layer (such as ITO, IZO) for the anode. The second is suggested to lay the cathode and the anode lead wires together on the side adjacent to the cathode for the reason that current is consumed mostly at the part of the cathode as well as the cathode lead wires rather than that consumed at the part of the anode and the anode lead wires as mentioned above. Therefore, to cut the cathode lead wires as short as possible will lower down its impedance for sure and reduce power consumption accordingly.

Figure 1A:
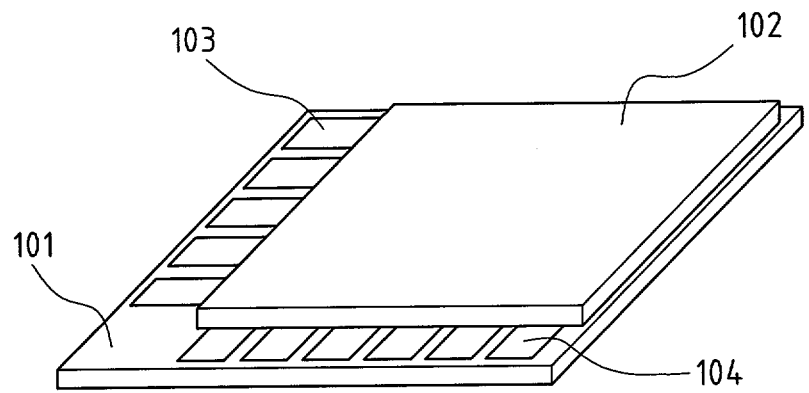
FIG. 1A shows a schematic structure of a conventional OLED display.
Figure 1B:
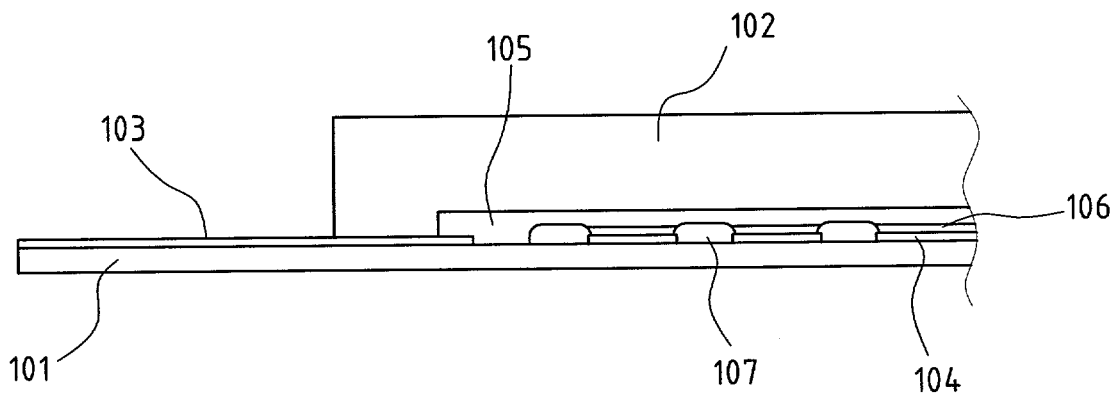
FIG. 1B shows a cutaway section in X-axis of the conventional OLED display shown in FIG. 1A.
Figure 1C:
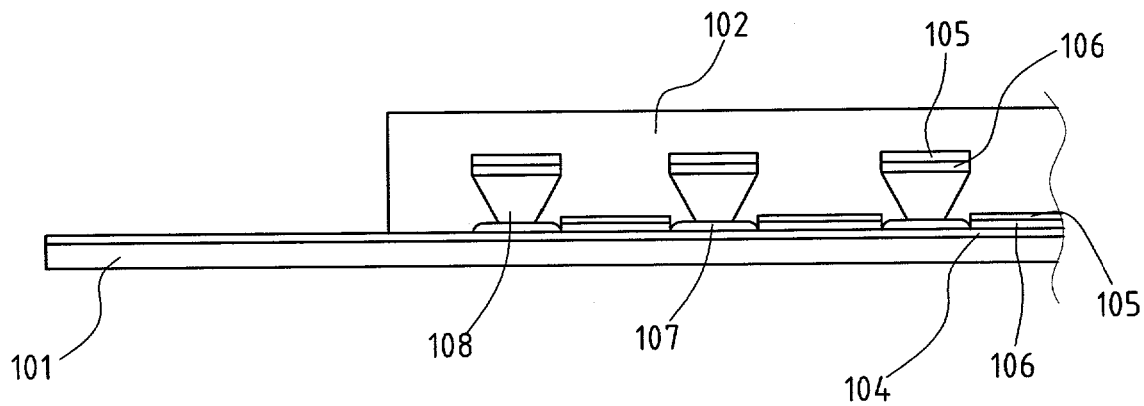
FIG. 1C shows a cutaway section in Y-axis of the conventional OLED display shown in FIG. 1A.
Figure 2:
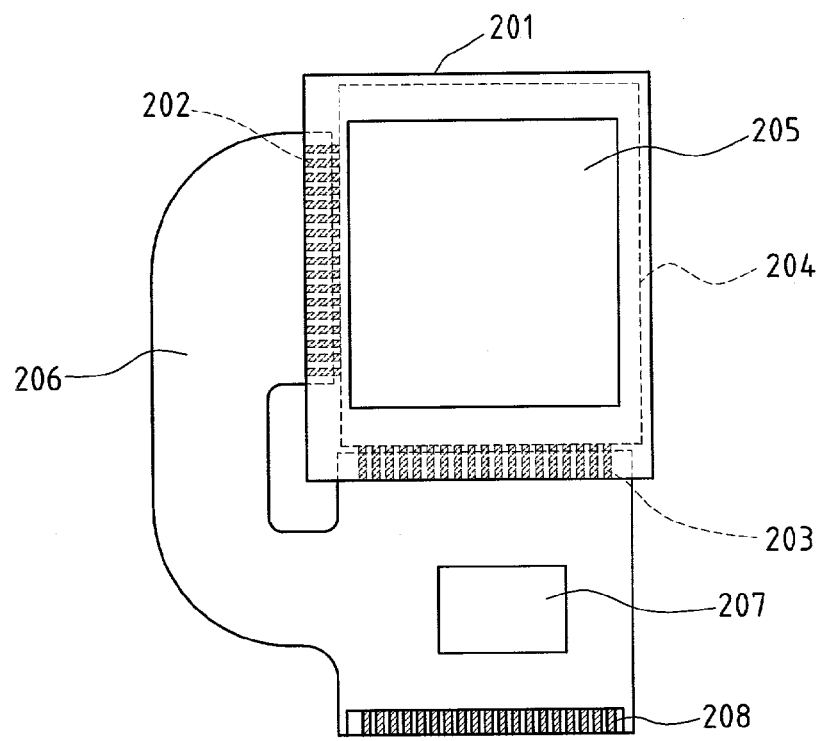
FIG. 2 shows an electrode-layout structure of a conventional OLED module.
Figure 3:
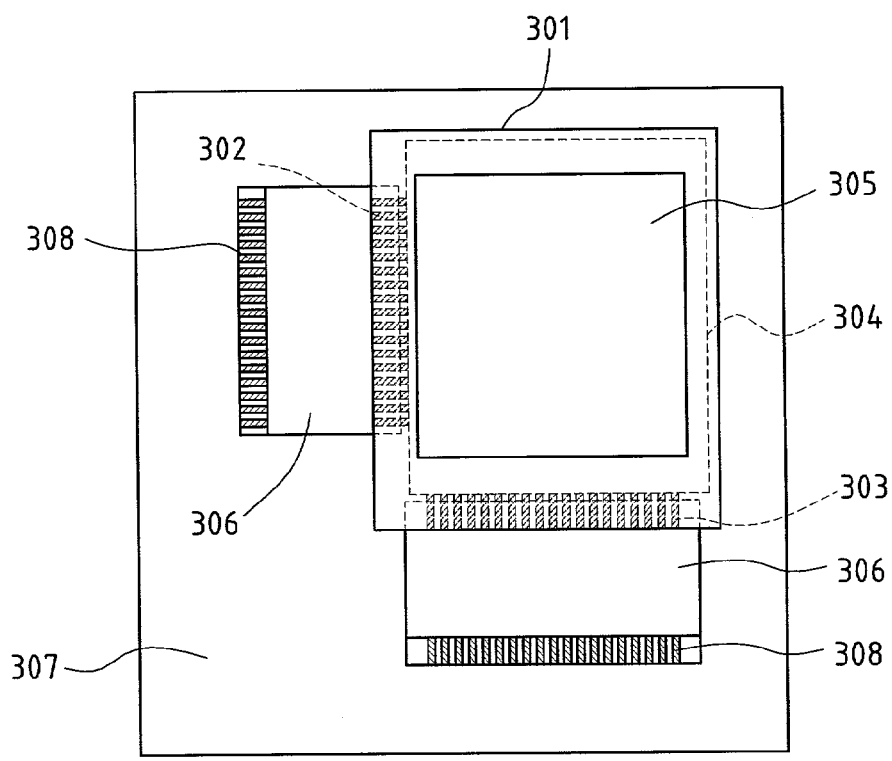
FIG. 3 shows another electrode-layout structure of the conventional OLED module.
Figure 4A:
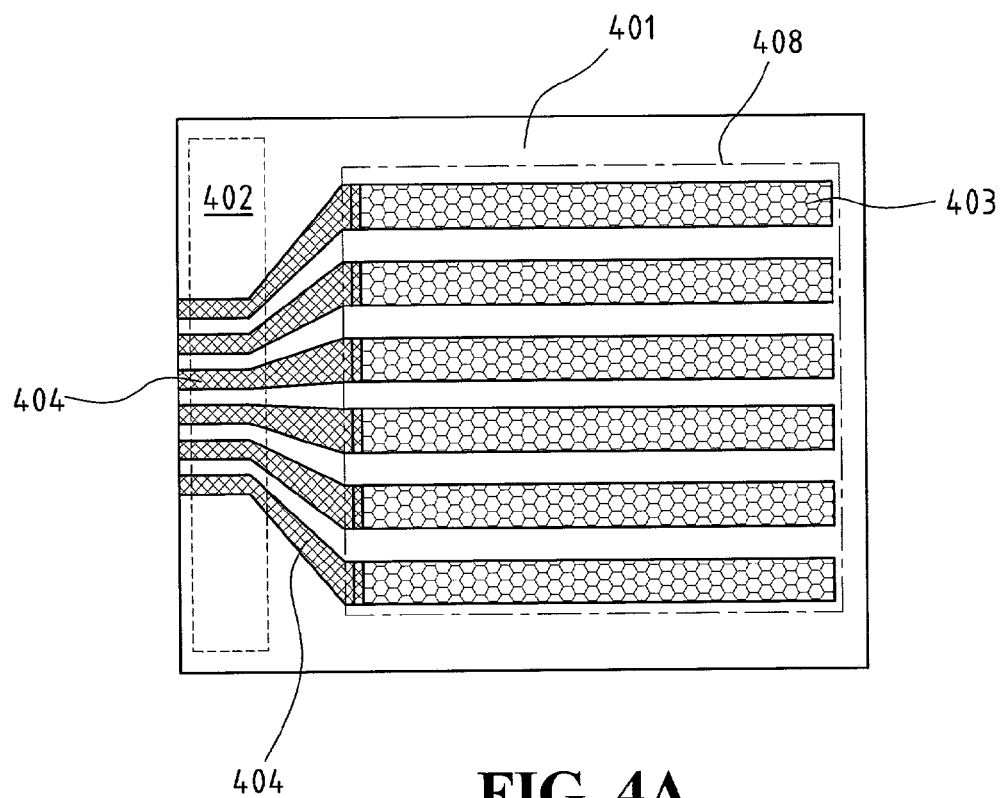
FIGS. 4A through 4C shows an embodiment of this invention.
Figure 4B:
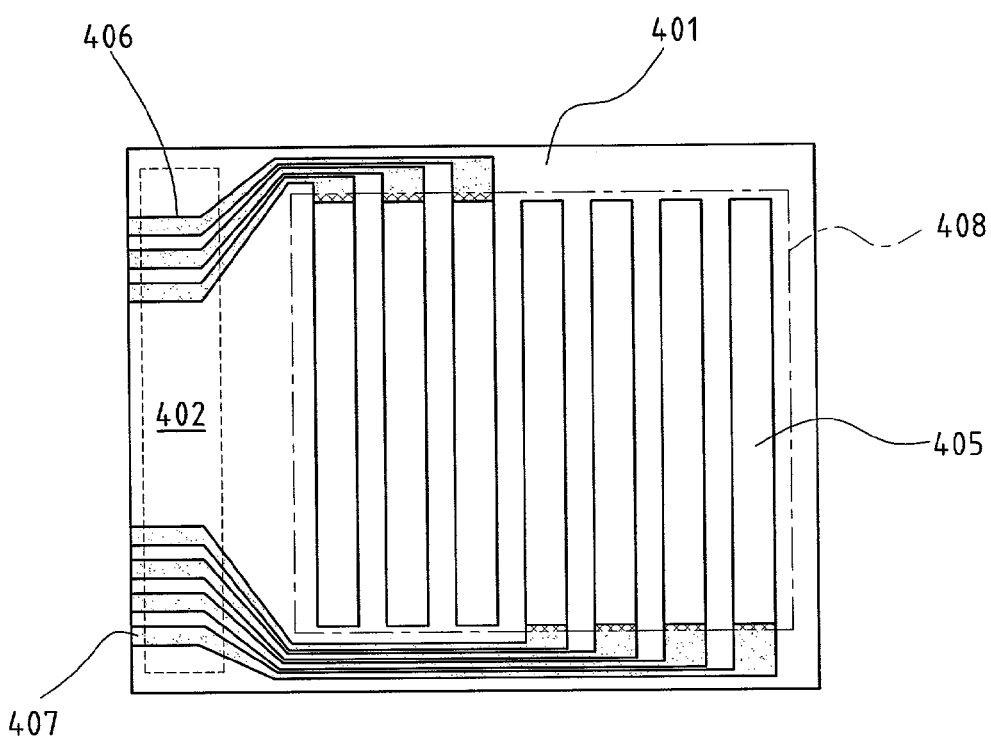
Figure 4C:
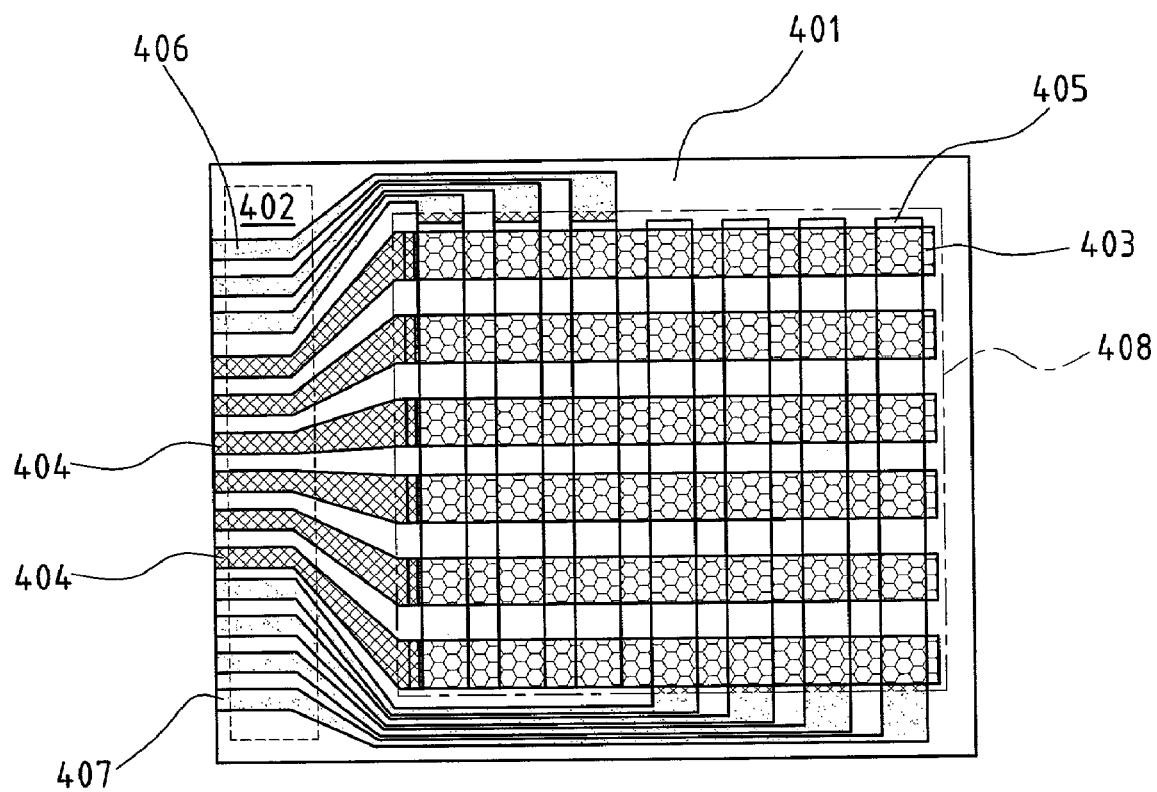

FIGS. 4A through 4C shows an embodiment of this invention. In the layout of the cathode lead wires shown in FIG. 4A, a lateral section 402 on a transparent substrate 401 is deemed as the input end of the output signals of an external driving circuit and is perpendicular to the extension direction of a plurality of cathode electrodes 403. There is also a plurality of cathode lead wires uniformly spaced on the lateral section 402.

In the layout of the anode lead wires shown in FIG. 4B, a plurality of first anode lead wires 406 uniformly laid and spaced in an upper part on the lateral section 402 of the transparent substrate 401 is connected to the ends of respective corresponding anode electrodes 405. Moreover, a plurality of second anode lead wires 407 is also arranged in the same way as that of the first anode lead wires 406 except that it is uniformly spaced in a lower part of the lateral section 402.

FIG. 4C is a combination chart of FIGS. 4A and 4B. In FIG. 4C, a plurality of anode electrodes 405 and cathode electrodes 403 are crossly aligned in a display section 408, and the first anode lead wires 406, the second anode lead wires 407, and a plurality of cathode lead wires 404 are disposed on the same lateral section 402.

Figure 5A:
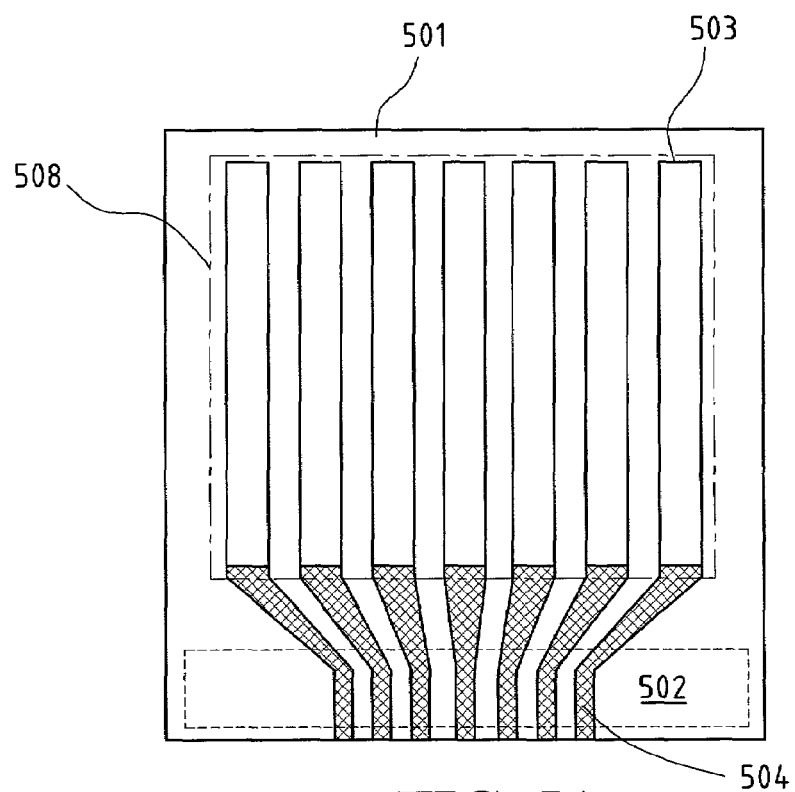
FIGS. 5A through 5C shows another embodiment of this invention.
Figure 5B:
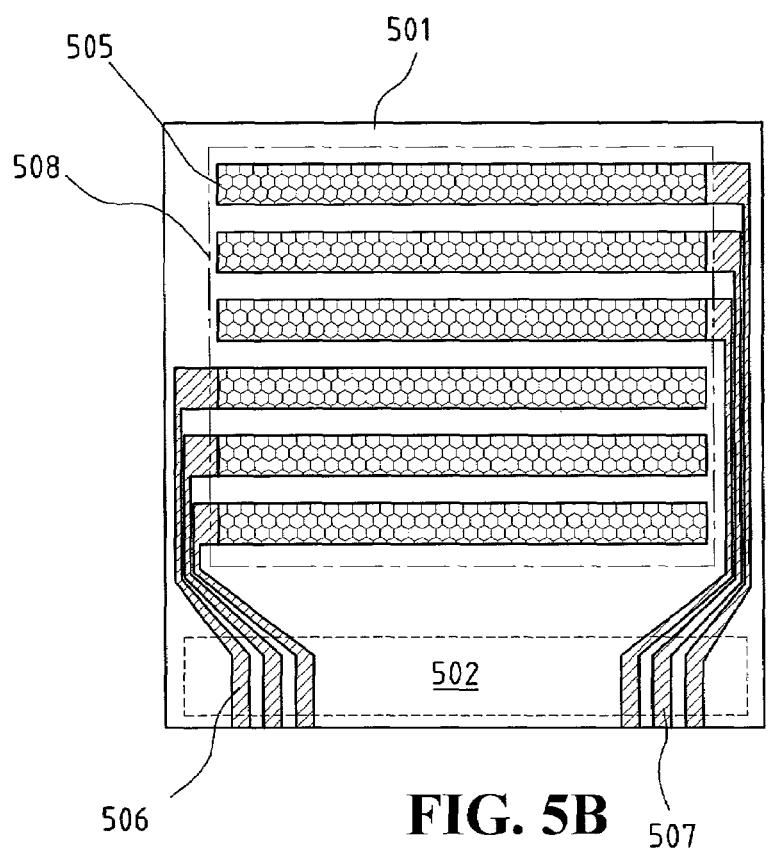
Figure 5C:
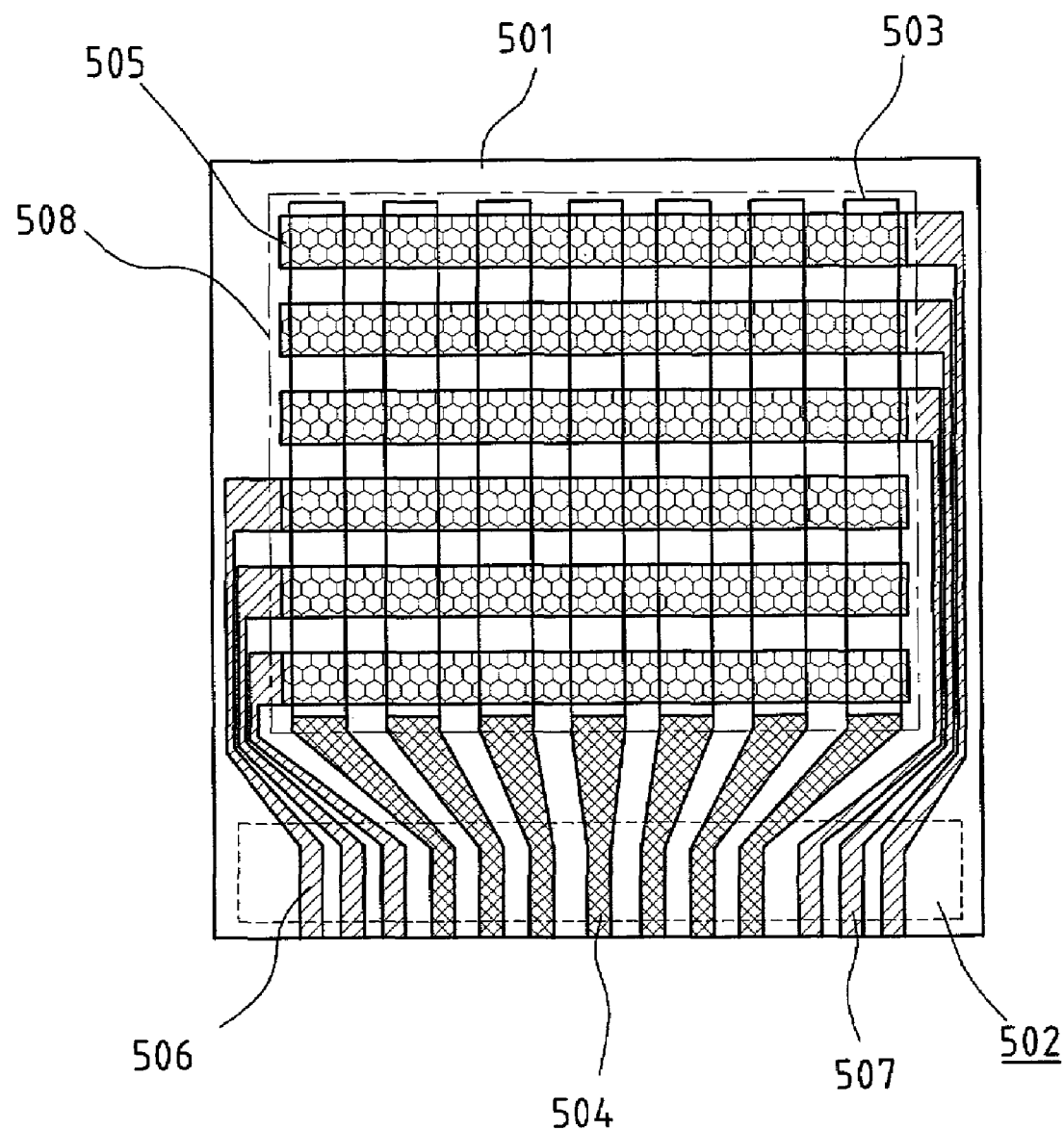

Under the premise of low impedance of the electrodes and lead wires thereof, the OLED display might have other options for the layout of electrode lead wires as indicated in FIGS. 5A through 5C, in addition to the abovesaid embodiment shown in FIG. 4. Generally speaking, the impedance of an electrode and its lead wire below 500 Ω is acceptable.

In the layout of the anode lead wires shown in FIG. 5B, a lateral section 502 on a transparent substrate 501 is an input end for receiving the output signals of an external driving circuit and is perpendicular to the extension direction of a plurality of anode electrodes 503. There is also a plurality of anode lead wires 504 uniformly spaced on the lateral section 502 of the transparent substrate 501 and connected to the respective anode electrodes 503.

FIG. 5C is a combination chart of FIGS. 5A and 5B. In FIG. 5C, a plurality of anode electrodes 503 and cathode electrodes 503 are crossly aligned in a display section 508, and the first cathode lead wires 506, the second cathode lead wires 507, and a plurality of anode lead wires 504 are disposed on the same lateral section 502.

In summarizing the above, the particularities of this invention might be induced as the following:

(1) All the electrodes can be connected with an external driving circuit by using a single coupling device to thereby reduce the cost and simplify the fabrication process.

(2) The arrangement of all the electrode lead wires on a single side of a transparent substrate is made possible and reduction of power consumption is realized.

(3) A new concept is provided for expanding design flexibility of a display panel and hence to a display module.

(4) The size of a display module according to this invention is the smallest compared with the conventional one.

In the above described, at least one preferred embodiment has been described in detail with reference to the drawings annexed, and it is apparent that numerous variations or modifications may be made without departing from the true spirit and scope thereof, as set forth in the claims below.

What is claimed is:

1. A layout structure of electrode lead wires for organic light-emitting diode (OLED) display, in which the display is provided with a plurality of cathode and anode electrodes and an external driving circuit for driving the electrodes, the layout structure comprises:

a transparent substrate having a lateral section perpendicular to an extension direction of the cathode electrodes to serve for an input end of the output signals of the external driving circuit;

a plurality of cathode lead wires connected to the corresponding cathode electrodes respectively and uniformly spaced on the lateral section of the transparent substrate;

a plurality of first anode lead wires connected to one end of the corresponding anode electrodes respectively and uniformly spaced on the lateral section of the transparent substrate; and a plurality of second anode lead wires connected to one end of the corresponding anode electrodes respectively and uniformly spaced on the lateral section of the transparent substrate.

2. The layout structure according to claim 1, in which the transparent substrate is a glass board or a transparent plastic plate.

3. The layout structure according to claim 1, in which the composition of the cathode electrode includes any element of Aluminum (Al), Magnesium (Mg), and Argentum (Ag).

4. The layout structure according to claim 1, in which the composition of the anode electrode includes Indium-Tin oxide (ITO) or Indium-Zinc oxide (IZO).

5. The layout structure according to claim 1, in which the cathode lead wires, the first anode lead wires, and the second anode lead wires are composed of a first Chrome (Cr) layer, an Aluminum (Al) layer, and a second Chrome (Cr) layer.

6. The layout structure according to claim 1, in which the cathode lead wires, the first anode lead wires, and the second anode lead wires are composed of a first Titan (Ti) layer, an Aluminum (Al) layer, and a second Titan (Ti) layer.

7. The layout structure according to claim 1, in which the cathode lead wires, the first anode lead wires, and the second anode lead wires are composed of any element of Aluminum (Al), Aurum (Au), Palladium (Pd), and Platinum (Pt).

8. A layout structure of electrode lead wires for organic light-emitting diode (OLED) display, in which the display is provided with a plurality of cathode and anode electrodes and an external driving circuit for driving the electrodes, the layout structure comprises:
- a transparent substrate having a lateral section perpendicular to an extension direction of the anode electrodes to serve for an input end of the output signals of the external driving circuit;
- a plurality of anode lead wires connected to the anode electrodes respectively and uniformly spaced on the lateral section of the transparent substrate;
- a plurality of first cathode lead wires connected to one end of the corresponding cathode electrodes respectively and uniformly spaced on the lateral section of the transparent substrate; and
- a plurality of second cathode lead wires connected to one end of the corresponding cathode electrodes respectively and uniformly spaced on the lateral section of the transparent substrate.

9. The layout structure according to claim 8, in which the transparent substrate is a glass board or a transparent plastic plate.

10. The layout structure according to claim 8, in which the composition of the anode electrode includes Indium-Tin oxide (ITO) or Indium-Zinc Oxide (IZO).

11. The layout structure according to claim 8 in which the composition of the cathode electrode includes any element of Aluminum (Al), Magnesium (Mg), and Argentum (Ag).

12. The layout structure according to claim 8, in which the anode lead wires, the first cathode lead wires, and the second cathode lead wires are composed of a first Chrome (Cr) layer, an Aluminum (Al) layer, and a second Chrome (Cr) layer.

13. The layout structure according to claim 8, in which the anode lead wires, the first cathode lead wires, and the second cathode lead wires are composed of a first Titan (Ti) layer, an Aluminum (Al) layer, and a second Titan (Ti) layer.

14. The layout structure according to claim 8, in which the anode lead wires, the first cathode lead wires, and the second cathode lead wires are composed of any element of Aluminum (Al), Aurum (Au), Palladium (Pd), and Platinum (Pt).

* * * * *